United States Patent
Lu et al.

(10) Patent No.: US 10,392,689 B2
(45) Date of Patent: Aug. 27, 2019

(54) HEAT TREATABLE COATED ARTICLE HAVING ZIRCONIUM NITRIDE AND ITO BASED IR REFLECTING LAYERS

(71) Applicant: Guardian Glass, LLC, Auburn Hills, MI (US)

(72) Inventors: Yiwei Lu, Ann Arbor, MI (US); Guowen Ding, San Jose, CA (US); Cesar Clavero, San Jose, CA (US); Daniel Schweigert, San Jose, CA (US); Guizhen Zhang, San Jose, CA (US); Scott Jewhurst, San Jose, CA (US); Daniel Lee, San Jose, CA (US)

(73) Assignee: GUARDIAN GLASS, LLC, Auburn Hills, MI (US)

( * ) Notice: Subject to any disclaimer, the term of this patent is extended or adjusted under 35 U.S.C. 154(b) by 0 days.

(21) Appl. No.: 15/440,175

(22) Filed: Feb. 23, 2017

(65) Prior Publication Data

US 2018/0237899 A1   Aug. 23, 2018

(51) Int. Cl.

| | |
|---|---|
| *B32B 15/04* | (2006.01) |
| *B32B 17/06* | (2006.01) |
| *C23C 14/08* | (2006.01) |
| *C23C 14/34* | (2006.01) |
| *C23C 14/06* | (2006.01) |
| *E06B 9/24* | (2006.01) |
| *C03C 17/34* | (2006.01) |

(52) U.S. Cl.
CPC ........ *C23C 14/086* (2013.01); *C03C 17/3435* (2013.01); *C23C 14/0641* (2013.01); *C23C 14/0652* (2013.01); *C23C 14/34* (2013.01); *E06B 9/24* (2013.01); *C03C 2217/948* (2013.01); *E06B 2009/2417* (2013.01)

(58) Field of Classification Search
USPC ................................................... 428/426, 432
See application file for complete search history.

(56) References Cited

U.S. PATENT DOCUMENTS

| | | |
|---|---|---|
| 5,216,542 A | 6/1993 | Szczyrbowski et al. |
| 6,159,607 A | 12/2000 | Hartig et al. |
| 6,188,512 B1 | 2/2001 | Woodard et al. |
| 6,749,941 B2 | 6/2004 | Lingle |
| 6,890,659 B2 | 5/2005 | Stachowiak |
| 6,926,967 B2 | 8/2005 | Neuman et al. |
| 6,994,910 B2 | 2/2006 | Stachowiak |

(Continued)

FOREIGN PATENT DOCUMENTS

| | | |
|---|---|---|
| JP | 63-206333 | 8/1988 |
| WO | WO 2015/197969 | 12/2015 |

(Continued)

OTHER PUBLICATIONS

WO2015197969 translation.*

(Continued)

*Primary Examiner* — Lauren R Colgan

(57) ABSTRACT

Coated articles include two or more functional infrared (IR) reflecting layers optionally sandwiched between at least dielectric layers. The dielectric layers may be of or including silicon nitride or the like. At least one of the IR reflecting layers is of or including zirconium nitride (e.g., ZrN) and at least another of the IR reflecting layers is of or including indium-tin-oxide (ITO).

25 Claims, 1 Drawing Sheet

(56) References Cited

U.S. PATENT DOCUMENTS

| | | |
|---|---|---|
| 7,037,587 B2 | 5/2006 | Lin |
| 7,081,301 B2 | 7/2006 | Stachowiak |
| 8,286,395 B2 | 10/2012 | Mauvernay et al. |
| 9,573,845 B2 | 2/2017 | Lemmer et al. |
| 2002/0192473 A1 | 12/2002 | Gentilhomme et al. |
| 2011/0210656 A1* | 9/2011 | Lemmer ............... E06B 3/6715 312/405 |
| 2011/0212311 A1* | 9/2011 | Lemmer ............. C03C 17/3417 428/212 |
| 2011/0262726 A1* | 10/2011 | Knoll ..................... C03C 17/36 428/213 |
| 2012/0021149 A1 | 1/2012 | Myli et al. |
| 2012/0177899 A1 | 7/2012 | Unquera et al. |
| 2015/0146286 A1 | 5/2015 | Hagen et al. |
| 2016/0002100 A1 | 1/2016 | Melcher et al. |
| 2016/0229741 A1 | 8/2016 | Canova et al. |

FOREIGN PATENT DOCUMENTS

| | | |
|---|---|---|
| WO | WO 2016/199676 | 12/2016 |
| WO | WO 2017/160326 | 9/2017 |

OTHER PUBLICATIONS

U.S. Appl. No. 15/440,065, filed Feb. 23, 2017, Boyce.
XP-022780655; Database WPI Week 201702; Clarivate Analytics.
U.S. Appl. No. 15/398,813, filed Jan. 5, 2017, Tucker et al.
U.S. Appl. No. 15/398,913, filed Jan. 5, 2017, Lu et al.

* cited by examiner

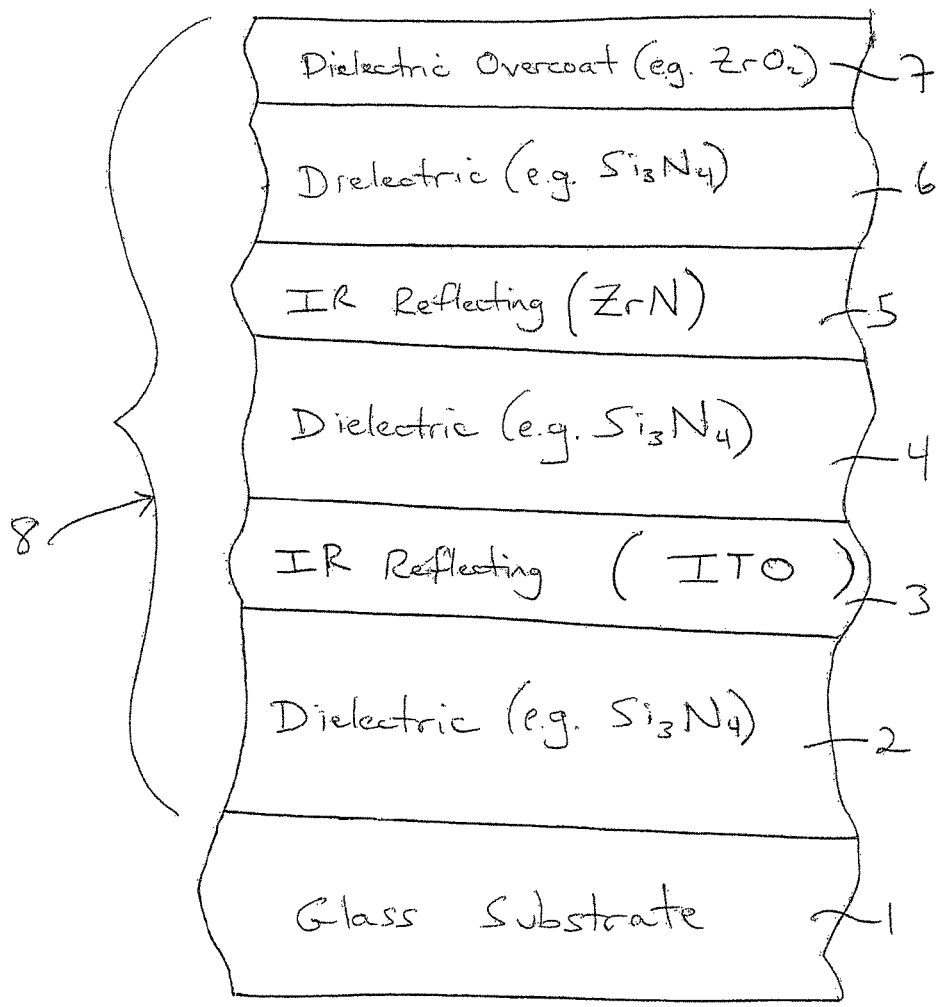

HEAT TREATABLE COATED ARTICLE HAVING ZIRCONIUM NITRIDE AND ITO BASED IR REFLECTING LAYERS This invention relates to coated articles that include two or more functional infrared (IR) reflecting layers possibly sandwiched between at least dielectric layers, and/or a method of making the same. In example embodiments, at least one of the IR reflecting layers is of or including zirconium nitride (e.g., ZrN) and at least another of the IR reflecting layers is of or including indium-tin-oxide (ITO). The coating may be designed so that the coated articles realize one or more of: desirable glass side reflective visible coloration that is not too red (e.g., glass side reflective a* color value(s) from −14 to +1.6); a desirably low solar heat gain coefficient (SHGC); desirable visible transmission (TY or $T_{vis}$); desirably low film side visible reflectance; thermal stability upon optional heat treatment (HT) such as thermal tempering; desirably low normal emittance ($E_n$); and/or desirably high light-to-solar gain ratio (LSG). Such coated articles may be used in the context of monolithic windows, insulating glass (IG) window units, laminated windows, and/or other suitable applications.

BACKGROUND AND SUMMARY OF THE INVENTION

Low solar factor (SF) and solar heat gain coefficient (SHGC) values are desired in some applications, particularly in warm weather climates. Solar factor (SF), calculated in accordance with EN standard 410, relates to a ratio between the total energy entering a room or the like through a glazing and the incident solar energy. Thus, it will be appreciated that lower SF values are indicative of good solar protection against undesirable heating of rooms or the like protected by windows/glazings. A low SF value is indicative of a coated article (e.g., IG window unit) that is capable of keeping a room fairly cool in summertime months during hot ambient conditions. Thus, low SF values are sometimes desirable in hot environments. High light-to-solar gain (LSG) values are also desirable. LSG is calculated as $T_{vis}$/SHGC. The higher the LSG value, the more visible light that is transmitted and the less amount of heat that is transmitted by the coated article. While low SF and SHGC values, and high LSG values, are sometimes desirable for coated articles such as IG window units and/or monolithic windows, the achievement of such values may come at the expense of sacrificing coloration and/or reflectivity values. In particular, conventional attempts to achieve low SHGC values have often resulted in undesirably low LSG values and/or undesirable visible coloration of the coating. It is often desirable, but difficult, to achieve a combination of acceptable visible transmission (TY or $T_{vis}$), low emissivity, desirable glass side reflective coloration (e.g., desirable a* and b* glass side reflective color values), low SHGC, and high LSG for a coated article in window applications, especially if it desired to use a glass substrate that is not deeply tinted.

SF (G-Factor; EN410-673 2011) and SHGC (NFRC-2001) values are calculated from the full spectrum ($T_{vis}$, Rg and Rf) and are typically measured with a spectrophotometer such as a Perkin Elmer 1050. The SF measurements are done on monolithic coated glass, and the calculated values can be applied to monolithic, IG and laminated applications.

Silver based low-E (low emissivity) coatings for windows are known in the art. However, silver is not particularly durable, and can be easily corroded if exposed to moisture for instance. Thus, silver based low-E coatings are not desirable for monolithic applications such as monolithic windows, and are typically used in IG window units including multiple glass panes, because of the durability problems of silver based low-E coatings.

Solar control coatings not based on silver are known, for example, having a layer stack of glass/$Si_3N_4$/NiCr/$Si_3N_4$/NiCr/$Si_3N_4$, where the NiCr layer may be nitrided. For example, see U.S. Patent Document 2012/0177899 which is hereby incorporated herein by reference. While layer stacks of U.S. Patent Document 2012/0177899 provide reasonable solar control and are overall good coatings, they are lacking in certain respects. The glass side reflective a* values (a* under $R_GY$) in Examples 1, 4 and 5 in paragraphs 0025-0026 of U.S. '899 are −17.8, −15.95, and +2.22, respectively. Examples 1 and 4 in U.S. '899 are undesirable because the glass side reflective a* values are too negative at −17.8 and −15.95, respectively. And when $R_GY$ is reduced down to 15.82% in Example 5, this results in the glass side reflective a* color value in Example 5 becoming too red with a value of +2.22. Thus, the coatings described in U.S. '899 were not able to achieve a combination of acceptable visible reflectivity values and glass side reflective a* coloration values.

It would be desirable according to example embodiments of this invention for a coating to be designed so as to have a combination of acceptable visible transmission (TY or $T_{vis}$), desirable glass side reflective coloration (e.g., desirable a* and/or b* reflective color values), desirably low film side visible reflectance, low emittance/emissivity, low SHGC, and high LSG for a coated article in window applications.

In certain example embodiments of this invention, certain applications such as monolithic window applications desire glass side reflective coloration that is not significantly red. In other words, certain applications such as monolithic window applications desire glass side reflective a* color values that are either negative or no greater than +1.6 or +1.0 (glass side reflective a* values higher than +1.6 are undesirably red). Such reflective a* values are especially desirable for example in the context of glass side reflective ($R_{G[or\ outside,\ or\ exterior]}Y$) a* values.

Certain embodiments of this invention relate to coated articles that include two or more functional infrared (IR) reflecting layers that may be sandwiched between at least transparent dielectric layers, and/or a method of making the same. The dielectric layers may be of or include silicon nitride or the like. In certain example embodiments, at least one of the IR reflecting layers is of or including zirconium nitride (e.g., ZrN) and at least another of the IR reflecting layers is of or including indium-tin-oxide (ITO). It has surprisingly and unexpectedly been found that the use of these different materials for the different IR reflecting layers in a given solar control coating surprisingly results in improved optics such as improved glass side reflective a* values, low emittance, low film side visible reflectance, and/or high LSG values which are often desirable characteristics in window applications, and the provision of the IR reflecting layer of or including ITO allows coated articles to be more easily tailored for desired visible transmission values while the IR reflecting layer of or including ZrN can keep the normal emissivity, SF and/or SHGC values reasonably low and improve durability. Coating according to embodiments of this invention may be designed so that before and/or after any optional heat treatment such as thermal tempering the coated articles realize one or more of:

desirable glass side reflective visible coloration that is not too red (e.g., reflective a* color value(s) from −14 to +1.6); a desirably low solar heat gain coefficient (SHGC); desirable visible transmission (TY or $T_{vis}$); desirably low film side visible reflectance; thermal stability upon optional heat treatment (HT) such as thermal tempering; desirably low normal emissivity/emittance ($E_n$); and/or desirably high light-to-solar gain ratio (LSG). Note that SHGC may be as high as 80% for uncoated glass. The higher the LSG value, the greater the energy saving. Such coated articles may be used in the context of monolithic windows, insulating glass (IG) window units, laminated windows, and/or other suitable applications.

In an example embodiment of this invention, there is provided a coated article including a coating supported by a glass substrate, the coating comprising: a first infrared (IR) reflecting layer comprising ITO on the glass substrate; a first dielectric layer comprising silicon nitride on the glass substrate over at least the first IR reflecting layer comprising ITO; a second layer IR reflecting layer comprising a nitride of zirconium on the glass substrate over at least the first dielectric layer comprising silicon nitride, so that the first dielectric layer comprising silicon nitride is located between at least the first IR reflecting layer comprising ITO and the second IR reflecting layer comprising the nitride of zirconium; a second dielectric layer comprising silicon nitride on the glass substrate over at least the second IR reflecting layer comprising the nitride of zirconium; wherein the coating contains no IR reflecting layer based on silver; wherein the coating has a normal emittance ($E_n$) value of no greater than 0.30; and wherein the coated article has: a visible transmission from about 15-80%, a film side visible reflectance no greater than 15%, a SHGC value of no greater than 0.45, a glass side reflective a* value of from −14.0 to +1.6, and a light-to-solar gain ratio (LSG) of at least 1.10.

In an example embodiment of this invention, there is provided a coated article including a coating supported by a glass substrate, the coating comprising: a first infrared (IR) reflecting layer comprising ITO on the glass substrate; a first dielectric layer comprising silicon nitride on the glass substrate over at least the first IR reflecting layer comprising ITO; a second layer IR reflecting layer comprising a nitride of zirconium on the glass substrate over at least the first dielectric layer comprising silicon nitride, so that the first dielectric layer comprising silicon nitride is located between at least the first IR reflecting layer comprising ITO and the second IR reflecting layer comprising the nitride of zirconium; a second dielectric layer comprising silicon nitride on the glass substrate over at least the second IR reflecting layer comprising the nitride of zirconium; wherein the coating contains no IR reflecting layer based on silver; wherein the coating has a normal emittance ($E_n$) value of no greater than 0.30; and wherein the coated article has: a visible transmission from about 15-80% and a light-to-solar gain ratio (LSG) of at least 1.17.

Thus, this invention covers monolithic window units, IG window units, laminated window units, and any other article including a glass substrate having a coating thereon as claimed. Note that monolithic measurements may be taken by removing a coated substrate from an IG window unit and/or laminated window unit, and then performing monolithic measurements. It is also noted that for a given coating the SF and SHGC values will be significantly higher for a monolithic window unit than for an IG window unit with the same coated article.

IN THE DRAWINGS

FIG. 1 is a partial cross sectional view of a monolithic coated article (heat treated or not heat treated) according to an example embodiment of this invention.

DETAILED DESCRIPTION OF CERTAIN EXAMPLE EMBODIMENTS OF THE INVENTION

Referring now more particularly to the accompanying drawings in which like reference numerals indicate like parts throughout the several views.

A coating 8 is designed so as to have a combination of acceptable visible transmission (TY or $T_{vis}$), desirable glass side reflective coloration (e.g., desirable a* and b* reflective color values), low film side visible reflectance, low emittance/emissivity, low SHGC, and high LSG for a coated article for use in window applications or the like. As visible transmission increases when the IR reflecting layer(s) become thinner, parameters such as SHGC will also increase, and normal emittance/emissivity ($E_n$) will decrease, with this being based on the desired transmission for instance of a given coated article for a given application. Example applications include architectural windows, residential windows, monolithic windows, automotive windows, and/or IG windows.

Certain embodiments of this invention relate to coated articles having a coating 8 on a glass substrate 1, where the coating includes two or more functional infrared (IR) reflecting layers 3 and 5 which may be sandwiched between at least transparent dielectric layers 2, 4, 6, 7, and/or a method of making the same. Some of the transparent dielectric layers, such as dielectric layer(s) 2 and/or 7, are optional and need not be provided in certain example embodiments. The dielectric layers 2, 4 and 6 may be of or include silicon nitride, silicon oxynitride, or the like. Transparent dielectric overcoat 7, of or including zirconium oxide or any other suitable material, is optional. In certain example embodiments, at least one of the IR reflecting layers is of or including zirconium nitride (e.g., ZrN) and at least another of the IR reflecting layers is of or including ITO. In the FIG. 1 embodiment, upper IR reflecting layer 5 is of or including zirconium nitride (e.g., ZrN) and lower IR reflecting layer 3 is of or including ITO. It has surprisingly and unexpectedly been found that the use of these different materials for the different IR reflecting layers 3 and 5 in a given solar control coating surprisingly results in improved optics such as improved glass side reflective a* values, low emittance, low film side visible reflectance, and/or higher LSG values which are often desirable characteristics in window applications, and the provision of the IR reflecting 3 layer of or including ITO allows coated articles to be more easily tailored for desired visible transmission values and high LSG values while the IR reflecting layer of or including ZrN 5 provides for desirably low normal emissivity and/or SHGC values for a given thickness of IR reflecting material. Coating 8 according to embodiments of this invention may be designed so that before and/or after any optional heat treatment such as thermal tempering the coated articles realize one or more of: desirable glass side reflective visible coloration that is not too red (e.g., reflective a* color value(s) from −14 to +1.6); a desirably low solar heat gain coefficient (SHGC); desirable visible transmission (TY or $T_{vis}$); low film side reflectance; thermal stability upon optional heat treatment (HT) such as thermal tempering; desirably low $E_n$; and/or a desirably high light-to-solar gain ratio (LSG). In example embodiments of this invention, the coating 8 contains no IR reflecting layer based on Ag or Au.

In certain example embodiments of this invention, certain applications such as monolithic window applications desire glass side reflective coloration that is not significantly red. In other words, certain applications such as monolithic window applications desire glass side reflective a* color values that are either negative or no greater than +1.6 (glass side reflective a* values higher than +1.6 are undesirably red). Such glass side reflective a* values are not too red and are desirable in the context of glass side reflective ($R_GY$) a* values.

Coated articles may optionally be heat treated in certain example embodiments of this invention, and are preferably designed to be heat treatable. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. The coated article may or may not be heat treated in different embodiments of this invention.

FIG. 1 is a cross sectional view of a coated article according to an example embodiment of this invention. In the FIG. 1 embodiment the solar control coating 8 includes two IR reflecting layers 3 and 5, and transparent dielectric layers 2, 4, 6 and 7. The coated article includes at least glass substrate 1 (e.g., clear, green, bronze, grey, blue, or blue-green glass substrate from about 1.0 to 12.0 mm thick, more preferably from 4-8 mm thick, with an example glass substrate thickness being 6 mm), transparent dielectric layers 2, 4, 6 (e.g., of or including silicon nitride [e.g., $Si_3N_4$], silicon oxynitride, silicon zirconium nitride, or some other suitable dielectric), and IR reflecting layers 3, 5. Upper IR reflecting layer 5 is of or including zirconium nitride (e.g., ZrN, preferably a stoichiometric or substantially stoichiometric type) and lower IR reflecting layer 3 is of or including conductive ITO. The upper IR reflecting layer 5 is of or includes $ZrN_x$ in certain example embodiments of this invention, where x is preferably from 0.8 to 1.2, more preferably from 0.9 to 1.1, with an example value being about 1.0. These "x" values provide for improved/lowered emittance values compared to if "x" is too low for instance. The zirconium nitride has been found to be very durable compared to silver for example, and more resistant to moisture induced corrosion compared to silver for example. It has surprisingly and unexpectedly been found that the use of these different materials for the different IR reflecting layers 3 and 5 in a given solar control coating provides for surprisingly results as explained herein. While the IR reflecting layer 5 may include some small amount of oxygen in certain instances, it is preferable that layer 5 is substantially free of oxygen such as no more than 8% oxygen, more preferably no more than about 5% oxygen, and most preferably no more than about 3% or 2% oxygen in certain embodiments (atomic %). The coated article may optionally include transparent dielectric overcoat layer 7 of or including a protective material such as zirconium oxide (e.g., $ZrO_2$) or silicon oxynitride. Optionally, a dielectric layer of or including silicon oxynitride and/or zirconium silicon oxynitride of any suitable stoichiometry may be located between and contacting layers 6 and 7 in the upper part of the layer stack in certain example embodiments. In certain example embodiments of this invention, coating 8 does not include any metallic IR blocking or reflecting layer of or based on Ag or Au. In certain example embodiments of this invention, IR reflecting layers 3 and 5 reflect at least some IR radiation, and do not contact any other metal or metal based IR reflecting layer. In certain example embodiments, it is possible for each of the layers to include other materials such as dopants. It will be appreciated of course that other layers may also be provided, or certain layers may be omitted, and different materials may be used, in certain alternative embodiments of this invention.

The overall coating 8 of FIG. 1 includes at least the illustrated layers in certain example embodiments, with layers 2 and 7 in particular being optional. It is noted that the terms "oxide" and "nitride" as used herein include various stoichiometries. For example, the term silicon nitride (for one or more of layers 2, 4, 6) includes stoichiometric $Si_3N_4$, as well as non-stoichiometric silicon nitride, and these layers may be doped with other material(s) such as Al and/or O. The illustrated layers may be deposited on glass substrate 1 via magnetron sputtering, any other type of sputtering, or via any other suitable technique in different embodiments of this invention. It is noted that other layer(s) may be provided in the stack shown in FIG. 1 such as between layers 2 and 3, or between layers 3 and 4, or between the substrate 1 and layer 2, or the like. Generally, other layer(s) may also be provided in other locations of the coating. Thus, while the coating 8 or layers thereof is/are "on" or "supported by" substrate 1 (directly or indirectly), other layer(s) may be provided therebetween. Thus, for example, the layer system 8 and layers thereof shown in FIG. 1 are considered "on" the substrate 1 even when other layer(s) may be provided therebetween (i.e., the terms "on" and "supported by" as used herein are not limited to directly contacting). However, there may be the direct contacts shown in FIG. 1 in preferred embodiments.

In certain example embodiments of this invention, dielectric layers 2, 4, and 6 may each have an index of refraction "n" of from 1.7 to 2.7 (at 550 nm), more preferably from 1.9 to 2.5 in certain embodiments, and most preferably from about 2.0 to 2.06 in preferred embodiments of this invention. One, two, three, or all of these layers 2, 4, 6 may be of or include silicon nitride and/or silicon oxynitride in certain example embodiments of this invention. In such embodiments of this invention where layers 2, 4, 6 comprise silicon nitride (e.g., $Si_3N_4$) or silicon oxynitride, sputtering targets including Si employed to form these layers may or may not be admixed with up to 1-20% (e.g., 8%) by weight aluminum or stainless steel (e.g. SS#316), with about this amount then appearing in the layers so formed. Even with this amount(s) of aluminum and/or stainless steel, such layers are still considered dielectric layers. In certain example embodiments, each of the IR reflecting layers 3 and 5 is provided between respective nitride layers (e.g., silicon nitride based layers 2, 4, 6) in order to reduce or prevent damage to the IR reflecting layers during possible heat treatment (e.g., thermal tempering, heat bending, and/or heat strengthening) thereby permitting predictable coloration to be achieved following the heat treatment at multiple viewing angles. While FIG. 1 illustrates a coated article according to an embodiment of this invention in monolithic form, coated articles according to other embodiments of this invention may comprise IG (insulating glass) window units or the like.

Turning back to the FIG. 1 embodiment, various thicknesses may be used consistent with one or more of the needs discussed herein. According to certain example embodiments of this invention, example thicknesses (in angstroms) and materials for the respective layers of the FIG. 1 embodiment on the glass substrate 1 are as follows in certain example embodiments for achieving desired transmission, glass side reflective coloration, low film side visible reflectance, low emittance, and desirably low SHGC value(s) and/or a desirably high LSG value (layers are listed in order moving away from the glass substrate 1):

TABLE 1

(Thicknesses in FIG. 1 embodiment)

| Layer | Example Range (Å) | Preferred (Å) | Example (Å) |
|---|---|---|---|
| silicon nitride (layer 2): | 20-500 Å | 40-200 Å | 50 Å |
| IR reflector (e.g., ITO) (layer 3): | 100-950 Å | 300-800 Å | 750 Å |
| silicon nitride (layer 4): | 150-1100 Å | 200-450 Å | 371 Å |
| IR reflector (e.g., ZrN) (layer 5): | 50-450 Å | 130-300 Å | 250 Å |
| silicon nitride (layer 6): | 20-800 Å | 300-550 Å | 514 Å |
| overcoat (e.g., ZrO$_2$) (layer 7): | 10-150 Å | 20-40 Å | 30 Å |

Table 1 above relates to, for example, embodiments where coating 8 is designed so that before and/or after any optional heat treatment such as thermal tempering the coated articles realize one, two, three, four, five, six or all of: desirable glass side reflective visible coloration such as not too red reflective color (e.g., reflective a* color value(s) from −14 to +1.6); a desirably low SHGC; desirable visible transmission; thermal stability upon optional HT such as thermal tempering; desirably low E$_n$; desirably low film side visible reflectance, and/or a desirably high LSG. In certain example embodiments, lower IR reflecting layer 5 may be physically thicker than upper IR reflecting layer by at least 50 angstroms (Å), more preferably by at least 100 Å, sometimes by at least 200 Å, and most preferably by at least 300 Å. In certain example embodiments of this invention, upper dielectric layer 6 is physically thicker than center dielectric layer 4 by at least 50 angstroms (Å), more preferably by at least 100 Å.

Before and/or after any optional heat treatment (HT) such as thermal tempering, in certain example embodiments of this invention coated articles according to the FIG. 1 embodiment may have color/optical characteristics as follows in Table 2 (measured monolithically). It is noted that subscript "G" stands for glass side reflective, subscript "T" stands for transmissive, and subscript "F" stands for film side reflective. As is known in the art, glass side (G) means when viewed from the glass side (as opposed to the layer/film side) of the coated article. Film side (F) means when viewed from the side of the coated article on which the coating is provided. The characteristics below in Table 2 are in accordance with Illuminant C, 2 degree Observer, and are applicable to HT and non-HT coated articles herein. Glass side reflective coloration may be such that coated articles appear neutral colored, blue-green colored, or yellow-green colored in various example embodiments of this invention.

TABLE 2

Color/Optical Characteristics (FIG. 1 embodiment monolithic)

| | General | Preferred | Most Preferred |
|---|---|---|---|
| T$_{vis}$ (TY): | 15-80% | 20-70% | 30-60% (or 35-45%) |
| a*$_T$ | −10 to +5 | −8 to +2 | −6 to 0' |
| b*$_T$ | −15 to +7 | −10 to +3 | −9 to +2 |
| R$_G$Y (glass side): | ≤40% | ≤35% | ≤30% |
| a*$_G$ | −14 to +1.6 | −10 to +1.6 | −8 to +1 |
| b*$_G$ | −15 to +9 | −9 to +4 | −8 to +1 |
| R$_F$Y (film side): | ≤15% | ≤12% | ≤10% |
| a*$_F$ | −15 to +15 | −11 to +11 | −3 to +11 |
| b*$_F$ | −25 to +9 | −20 to +4 | −16 to 0 |
| E$_n$: | ≤0.30 | ≤0.25 | ≤0.22 |
| SHGC: | ≤0.45 | ≤0.40 | ≤0.33 |
| LSG: | ≥1.10 | ≥1.17 | ≥1.25 |

For purposes of example only, Example 1 representing an example embodiments of this invention, as well we Comparative Examples (CE) 1-5, are set forth below.

EXAMPLES

Comparative Examples (CEs) 1-4 and Example 1 were sputter-deposited (as all examples) layer stacks on clear glass substrates. And CE 5 was a layer stack modeled on a green glass substrate. The optical measurements are monolithic measurements. Optical data for CEs 1-5 and Example 1 is in accordance with Illuminant C, 2 degree Observer. The silicon nitride layers were doped with about 8% Al. The ZrN layers were approximately stoichiometric. Layer thicknesses are in angstroms (Å). "L" in Table 4 below stand for Layer (e.g., L2 means layer 2 shown in FIG. 1, L3 means layer 3 shown in FIG. 1, and so forth). It will be shown below that the use of ITO for layer 3 and ZrN for layer 5 in Example 1 provided for unexpectedly improved optics compared to the use of TiN or NiCr for layer 3, and TiN for layer 5, in CEs 1-5.

TABLE 3

Layer Stacks of Comparative Examples (CEs) 1-5

| Example | L2(Si$_3$N$_4$) | L3(NiCr) or L3(TiN) | L4(Si$_3$N$_4$) | L5(TiN) | L6(Si$_3$N$_4$) | L7(ZrO$_2$) |
|---|---|---|---|---|---|---|
| CE 1: | 220 | n/a | 240 | 670 | 310 | 10 | 40 |
| CE 2: | 140 | n/a | 200 | 590 | 240 | 30 | 40 |
| CE 3: | 40 | n/a | 180 | 350 | 120 | 30 | 40 |
| CE4: | 50 | 68 | n/a | 723 | 268 | 171 | 30 |
| CE5: | 50 | 66 | n/a | 714 | 261 | 206 | 30 |

Measured monolithically after thermal tempering (HT), the CEs had the following characteristics.

TABLE 4

Measured Monolithic Optical Data (CEs 1-5)

| Parameter | CE 1 | CE 2 | CE 3 | CE4 | CE5 |
|---|---|---|---|---|---|
| $T_{vis}$ (TY) (transmission): | 18.6% | 24.2% | 35.3% | 23.1% | 21.8% |
| $L^*_T$: | 50.2 | 56.3 | 66.0 | 55.2 | 53.8 |
| $a^*_T$: | −7.2 | −7.0 | −5.5 | −3.15 | −5.86 |
| $b^*_T$: | −4.3 | −1.5 | −0.8 | −8.27 | −7.97 |
| $R_GY$ (glass side refl. %): | 9.5% | 9.2% | 13.0% | 12.0% | 9.6% |
| $L^*_G$: | 36.9 | 36.4 | 42.8 | 41.2 | 37.1 |
| $a^*_G$: | −3.2 | −2.8 | −0.3 | −0.8 | −1.45 |
| $b^*_G$: | −3.5 | 0.4 | −5.7 | −1.8 | −2.1 |
| $R_FY$ (film side refl. %): | 25.2% | 19.1% | 10.8% | 14.1% | 11.2% |
| $L^*_F$: | 57.3 | 50.8 | 39.2 | 44.4 | 39.9 |
| $a^*_F$: | 5.3 | 4.7 | 7.0 | 0.6 | −0.3 |
| $b^*_F$: | −8.3 | −6.1 | −5.4 | −4.9 | −4.1 |
| $E_n$: | 0.18 | 0.25 | 0.36 | 0.25 | 0.25 |
| SHGC (NFRC-2001): | 0.21 | 0.24 | 0.31 | 0.28 | 0.27 |
| LSG: | 0.80 | 1.01 | 1.14 | 0.83 | 0.81 |

Example 1 according to an example of this invention had the following layer stack. Layer thicknesses are in angstroms (Å).

TABLE 5

Layer Stack of Example 1

| Example | L3 (ITO) | L4 ($Si_3N_4$) | L5 (ZrN) | L6 ($Si_3N_4$) |
|---|---|---|---|---|
| Ex. 1: | 750 | 371 | 250 | 514 |

Measured monolithically, Example 1 had the following characteristics.

TABLE 6

Measured Monolithic Optical Data (Example 1)

| Parameter | Example 1 |
|---|---|
| $T_{vis}$ (TY) (transmission): | 39.6% |
| $a^*_T$: | −3.01 |
| $b^*_T$: | +0.65 |
| $R_GY$ (glass side refl. %): | 28.9% |
| $a^*_G$: | −7.06 |
| $b^*_G$: | −5.9 |
| $R_FY$ (film side refl. %): | 9.5% |
| $a^*_F$: | +9.9 |
| $b^*_F$: | −14.8 |
| $E_n$: | 0.197 |
| SHGC (NFRC-2001): | 0.31 |
| LSG: | 1.30 |

It can be seen by comparing CEs 1-5 (Tables 3-4) with Example 1 (Tables 5-6), that the use of ITO and ZrN in Example 1 for layers 3 and 5, respectively, provided for unexpected results. For instance, the LSG values of CEs 1, 2, 4 and 5 were all 1.01 or less, which is undesirable. And while the LSG of CE3 was 1.14, CE3 could not maintain a low emittance as evidenced by its undesirably high normal emittance/emissivity ($E_n$) of 0.36, which means that insufficient IR is blocked by the coating of CE3. No comparative example (CE) has a sufficiently low normal emittance/ emissivity ($E_n$) combined with desirably high LSG, desirably low SHGC, and desirably low film side visible reflectance.

The use of ITO for layer 3 and ZrN for layer 5 in Example 1 unexpectedly allowed for a combination of high LSG, low SHGC, and low emittance/emissivity ($E_n$), along with reduced film side visible reflectance and glass side reflective coloration that was not too red. The LSG value of 1.30 means a significant energy saving.

In an example embodiment of this invention, there is provided a coated article including a coating supported by a glass substrate, the coating comprising: a first infrared (IR) reflecting layer comprising ITO on the glass substrate; a first dielectric layer comprising silicon nitride on the glass substrate over at least the first IR reflecting layer comprising ITO; a second layer IR reflecting layer comprising a nitride of zirconium on the glass substrate over at least the first dielectric layer comprising silicon nitride, so that the first dielectric layer comprising silicon nitride is located between at least the first IR reflecting layer comprising ITO and the second IR reflecting layer comprising the nitride of zirconium; a second dielectric layer comprising silicon nitride on the glass substrate over at least the second IR reflecting layer comprising the nitride of zirconium; wherein the coating contains no IR reflecting layer based on silver; wherein the coating has a normal emittance ($E_n$) value of no greater than 0.30; and wherein the coated article has: a visible transmission from about 15-80%, a film side visible reflectance no greater than 15%, an SHGC value of no greater than 0.45, a glass side reflective a* value of from −14.0 to +1.6, and a light-to-solar gain ratio (LSG) of at least 1.10.

In the coated article of the immediately preceding paragraph, the coating in some instances contains only two IR reflecting layers.

In the coated article of any of the preceding two paragraphs, the first dielectric layer comprising silicon nitride may be located between and directly contacting the first and second IR reflecting layers.

In the coated article of any of the preceding three paragraphs, the second IR reflecting layer comprising the nitride of zirconium may comprise $ZrN_x$, where x is from 0.8 to 1.2, more preferably from 0.9 to 1.1.

In the coated article of any of the preceding four paragraphs, the second IR reflecting layer may contain from 0-8% oxygen (atomic %), more preferably from 0-5% oxygen (atomic %).

In the coated article of any of the preceding five paragraphs, the coating may further comprise another dielectric layer comprising silicon nitride and/or silicon oxynitride located between and contacting the glass substrate and the first IR reflecting layer.

In the coated article of any of the preceding six paragraphs, the second IR reflecting layer may consist essentially of the nitride of zirconium.

In the coated article of any of the preceding seven paragraphs, the coating may further comprise an overcoat comprising an oxide of zirconium.

In the coated article of any of the preceding eight paragraphs, the coated article may have a visible transmission from about 20-70% (more preferably from 30-60%, and most preferably from 35-45%) and/or a light-to-solar gain ratio (LSG) of at least 1.17.

In the coated article of any of the preceding nine paragraphs, the coated article may have a light-to-solar gain ratio (LSG) of at least 1.17, more preferably an LSG of at least 1.25.

In the coated article of any of the preceding ten paragraphs, the coated article may have a film side visible reflectance no greater than 12%, more preferably no greater than 10%.

In the coated article of any of the preceding eleven paragraphs, the glass substrate may be a clear glass substrate, and may or may not be heat treated (e.g., thermally tempered).

In the coated article of any of the preceding twelve paragraphs, the coated article may have a glass side reflective a* value of from −10 to +1.6, and/or a film side reflective a* value of from −15 to +15.

In the coated article of any of the preceding thirteen paragraphs, one or more of the dielectric layers comprising silicon nitride may further comprise oxygen and/or may be doped with aluminum.

In the coated article of any of the preceding fourteen paragraphs, the coated article may be a monolithic window.

In the coated article of any of the preceding fifteen paragraphs, the coated article measured monolithically may have an SHGC value of no greater than 0.40, more preferably no greater than 0.33.

In the coated article of any of the preceding sixteen paragraphs, the first IR reflecting layer comprising ITO may be from 100-950 Å thick, and/or the second IR reflecting layer comprising the nitride of zirconium may be from 50-450 Å thick.

In the coated article of any of the preceding seventeen paragraphs, the first IR reflecting layer comprising ITO may be from 300-800 Å thick, and/or the second IR reflecting layer comprising the nitride of zirconium may be from 130-300 Å thick.

In the coated article of any of the preceding eighteen paragraphs, the first IR reflecting layer comprising ITO may be physically thicker than the second IR reflecting layer comprising the nitride of zirconium by at least 50 Å, more preferably by at least 100 Å, even more preferably by at least 200 Å, and most preferably by at least 300 Å.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article including a coating supported by a glass substrate, the coating comprising:
   a first dielectric layer comprising silicon nitride on the glass substrate;
   a first infrared (IR) reflecting layer comprising ITO on the glass substrate, wherein the first dielectric layer comprising silicon nitride is located between at least the glass substrate and the first IR reflecting layer comprising ITO;
   a second dielectric layer comprising silicon nitride on the glass substrate over at least the first IR reflecting layer comprising ITO;
   a second layer IR reflecting layer comprising a nitride of zirconium on the glass substrate over at least the first and second dielectric layers comprising silicon nitride, so that the second dielectric layer comprising silicon nitride is located between at least the first IR reflecting layer comprising ITO and the second IR reflecting layer comprising the nitride of zirconium;
   a third dielectric layer comprising silicon nitride on the glass substrate over at least the second IR reflecting layer comprising the nitride of zirconium;
   wherein the first IR reflecting layer comprising ITO is from 300-800 Å thick, and the second IR reflecting layer comprising the nitride of zirconium is from 130-300 Å thick;
   wherein the coating contains no IR reflecting layer based on silver, and contains only two IR reflecting layers;
   wherein the coating has a normal emittance ($E_n$) value of no greater than 0.30; and
   wherein the coated article has: a visible transmission from about 15-80%, a film side visible reflectance no greater than 15%, an SHGC value of no greater than 0.45, a glass side reflective a* value of from −14.0 to +1.6, and a light-to-solar gain ratio (LSG) of at least 1.10.

2. The coated article of claim 1, wherein the first dielectric layer comprising silicon nitride is located between and directly contacting the first and second IR reflecting layers.

3. The coated article of claim 1, wherein the second IR reflecting layer comprising the nitride of zirconium comprises $ZrN_x$, where x is from 0.8 to 1.2.

4. The coated article of claim 1, wherein the second IR reflecting layer comprising the nitride of zirconium comprises $ZrN_x$, where x is from 0.9 to 1.1.

5. The coated article of claim 1, wherein the second IR reflecting layer contains from 0-8% oxygen (atomic %).

6. The coated article of claim 1, wherein the second IR reflecting layer contains from 0-5% oxygen (atomic %).

7. The coated article of claim 1, wherein the coating further comprises another dielectric layer comprising silicon nitride located between and contacting the glass substrate and the first IR reflecting layer.

8. The coated article of claim 7, wherein the another dielectric layer comprising silicon nitride further comprises oxygen.

9. The coated article of claim 1, where the second IR reflecting layer consists essentially of the nitride of zirconium.

10. The coated article of claim 1, wherein the coating further comprises an overcoat comprising an oxide of zirconium.

11. The coated article of claim 1, wherein the coated article has a visible transmission from about 20-70%, and a light-to-solar gain ratio (LSG) of at least 1.17.

12. The coated article of claim 1, wherein the coated article has a light-to-solar gain ratio (LSG) of at least 1.25.

13. The coated article of claim 1, wherein the coated article has a film side visible reflectance no greater than 12%.

14. The coated article of claim 1, wherein the coated article has a film side visible reflectance no greater than 10%.

15. The coated article of claim 1, wherein the glass substrate is a clear glass substrate.

16. The coated article of claim 1, wherein the coated article has a glass side reflective a* value of from −10 to +1.6, and a film side reflective a* value of from −15 to +15.

17. The coated article of claim 1, wherein one or more of the dielectric layers comprising silicon nitride further comprises oxygen and is doped with aluminum.

18. The coated article of claim 1, wherein the coated article is a monolithic window.

19. The coated article of claim 1, wherein the coated article measured monolithically has an SHGC value of no greater than 0.40.

20. The coated article of claim 1, wherein the coated article measured monolithically has an SHGC value of no greater than 0.33.

21. The coated article of claim 1, wherein the first IR reflecting layer comprising ITO is physically thicker than the second IR reflecting layer comprising the nitride of zirconium by at least 100 Å.

22. The coated article of claim 1, wherein the first IR reflecting layer comprising ITO is physically thicker than the second IR reflecting layer comprising the nitride of zirconium by at least 300 Å.

23. A coated article including a coating supported by a glass substrate, the coating comprising:
- a first dielectric layer comprising silicon nitride on the glass substrate;
- a first infrared (IR) reflecting layer comprising ITO on the glass substrate, wherein the first dielectric layer comprising silicon nitride is located between at least the glass substrate and the first IR reflecting layer comprising ITO;
- a second dielectric layer comprising silicon nitride on the glass substrate over at least the first IR reflecting layer comprising ITO;
- a second layer IR reflecting layer comprising a nitride of zirconium on the glass substrate over at least the first and second dielectric layers comprising silicon nitride, so that the second dielectric layer comprising silicon nitride is located between and directly contacting the first IR reflecting layer comprising ITO and the second IR reflecting layer comprising the nitride of zirconium;
- a third dielectric layer comprising silicon nitride on the glass substrate over at least the second IR reflecting layer comprising the nitride of zirconium;
- wherein the first IR reflecting layer comprising ITO is from 300-800 A thick, and the second IR reflecting layer comprising the nitride of zirconium is from 130-300 A thick;
- wherein the coating contains no IR reflecting layer based on silver, and contains only two IR reflecting layers;
- wherein the coating has a normal emittance ($E_n$) value of no greater than 0.30; and
- wherein the coated article has a visible transmission from about 15-80% and a light-to-solar gain ratio (LSG) of at least 1.17.

24. The coated article of claim 23, wherein the first IR reflecting layer comprising ITO is physically thicker than the second IR reflecting layer comprising the nitride of zirconium by at least 100 Å.

25. The coated article of claim 23, wherein the first IR reflecting layer comprising ITO is physically thicker than the second IR reflecting layer comprising the nitride of zirconium by at least 300 Å.

* * * * *